United States Patent
Bao et al.

(10) Patent No.: US 7,126,700 B2
(45) Date of Patent: Oct. 24, 2006

(54) PARAMETRIC OPTIMIZATION OF OPTICAL METROLOGY MODEL

(75) Inventors: Junwei Bao, Fremont, CA (US); Vi Vuong, Fremont, CA (US); Manuel Madriaga, Santa Clara, CA (US); Daniel Prager, Hopewell Junction, NY (US)

(73) Assignee: Timbre Technologies, Inc., Santa Clara, CA (US)

( * ) Notice: Subject to any disclaimer, the term of this patent is extended or adjusted under 35 U.S.C. 154(b) by 467 days.

(21) Appl. No.: 10/735,212

(22) Filed: Dec. 12, 2003

(65) Prior Publication Data

US 2005/0128489 A1      Jun. 16, 2005

(51) Int. Cl.
G01B 11/02 (2006.01)
G01B 11/24 (2006.01)

(52) U.S. Cl. ............... 356/625; 356/601; 702/155; 702/189

(58) Field of Classification Search ................ 356/601, 356/625, 636, 237.5; 702/189; 402/189
See application file for complete search history.

(56) References Cited

U.S. PATENT DOCUMENTS

| 6,609,086 B1 | 8/2003 | Bao et al. |
| 6,785,638 B1 | 8/2004 | Niu et al. |
| 6,943,900 B1 | 9/2005 | Niu et al. |

Primary Examiner—Richard A. Rosenberger
(74) Attorney, Agent, or Firm—Morrison & Foerster LLP

(57) ABSTRACT

The profile of an integrated circuit structure is determined by obtaining a measured metrology signal and a first simulated metrology signal, which has an associated profile model of the structure defined by a set of profile parameters. When the two signals match within a first termination criterion, at least one profile parameter is selected from the set of profile parameters. A value for the selected profile parameter is determined. A second simulated metrology signal having an associated profile model of the structure defined by a set of profile parameters with at least one profile parameter equal or close to the determined value for the selected profile parameter is obtained. When the measured and the second simulated metrology signals match within a second termination criterion, values for one or more remaining profile parameters are determined from the set of profile parameters associated with the second simulated metrology signal.

56 Claims, 16 Drawing Sheets

1602

| Predetermination Technique | Parametric Processor | Profile Evaluator |
|---|---|---|
| One-time predetermination of one or more parameters | Regression | Library Matching |
| | Regression | Regression |
| | Library Matching | Library Matching |
| | Library Matching | Regression |
| Serial predetermination of one or more parameters | Regression | Library Matching |
| | Regression | Regression |
| | Library Matching | Library Matching |
| | Library Matching | Regression |
| Parallel predetermination of one or more parameters | Regression | Library Matching |
| | Regression | Regression |
| | Library Matching | Library Matching |
| | Library Matching | Regression |

FIG. 16

PARAMETRIC OPTIMIZATION OF OPTICAL METROLOGY MODEL

BACKGROUND

1. Field of Invention

The present application relates to integrated circuit (IC) metrology and more particularly to the use of metrology systems and profile modeling to determine the profiles of IC structures.

2. Related Art

With the current drive towards smaller geometries of IC features, feature measurement is increasingly difficult as the size of the features become smaller. However, knowledge of the dimensions of gratings or structures is essential in order to determine if the dimensions of the features are within the acceptable ranges and if, for example, a particular fabrication process causes the sidewalls of the features to be tapered, vertical, T-topped, undercut, or have footings.

Traditionally, a sample was cleaved and examined with a scanning electron microscope (SEM) or similar device. The cross-section SEM method is typically slow, expensive, and destructive, whereas the critical dimension (CD) SEM method only provides one measurement number seen from the top of the feature.

Additionally, scatterometry, such as spectroscopic reflectometry and ellipsometry, is used to beam light on the structure and measure the reflected/diffracted beam. A commonly encountered problem in scatterometry is profile parameter correlation. For example, two or more of the profile parameters in the set of profile parameters that define a profile model may be correlated such that variation in one profile parameter produces a variation in the other correlated profile parameter. When determining the profile of an integrated circuit using scatterometry, this correlation between profile parameters can produce inaccurate results, meaning that the determined profile for the integrated circuit differs from the actual profile of the integrated circuit.

SUMMARY

In one exemplary embodiment, the profile of an integrated circuit structure is determined by obtaining a measured metrology signal and a first simulated metrology signal, which has an associated profile model of the structure defined by a set of profile parameters. When the two signals match within a first termination criterion, at least one profile parameter is selected from the set of profile parameters. A value for the selected profile parameter is determined. A second simulated metrology signal having an associated profile model of the structure defined by a set of profile parameters with at least one profile parameter equal or close to the determined value for the selected profile parameter is obtained. When the measured and second simulated metrology signals match within a second termination criterion, values for one or more remaining profile parameters are determined from the set of profile parameters associated with the second simulated metrology signal.

BRIEF DESCRIPTION OF DRAWINGS

FIG. 16 depicts a partial list of profile parameter predetermination techniques and profile parameter extraction.

DETAILED DESCRIPTION OF EXEMPLARY EMBODIMENT(S)

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
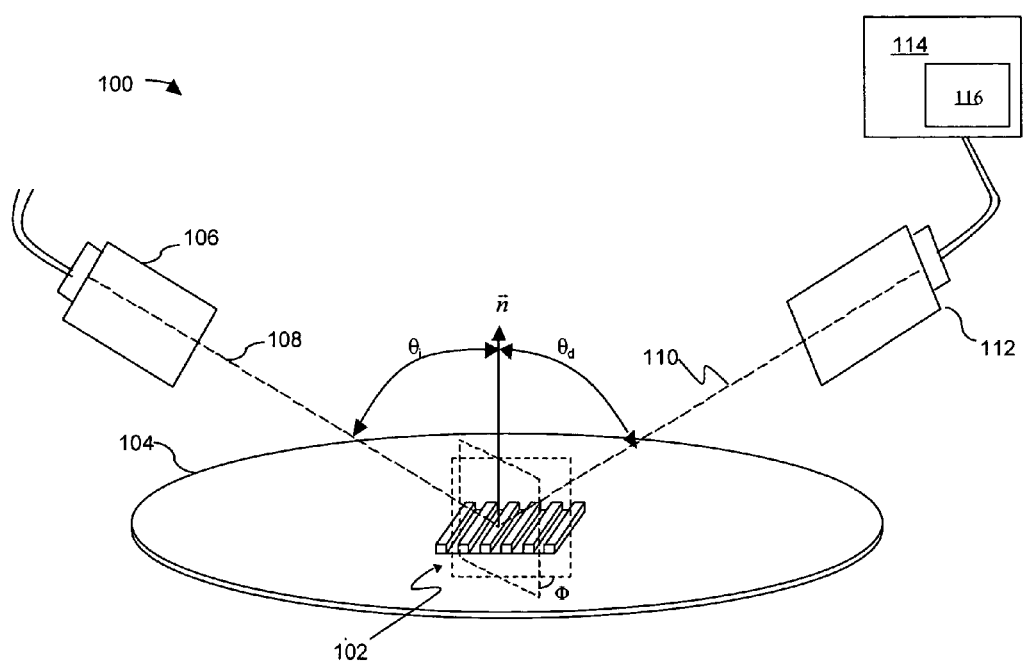
FIG. 1 depicts an exemplary optical metrology device.

With reference to FIG. 1, an optical metrology system 100 can be used to examine and analyze a structure formed on a semiconductor wafer. For example, optical metrology system 100 can be used to determine the profile of a grating 102 formed on wafer 104. Grating 102 can be formed in test areas on wafer 104, such as adjacent to a device formed on wafer 104. Alternatively, grating 102 can be formed in an area of the device that does not interfere with the operation of the device or along scribe lines on wafer 104.

As depicted in FIG. 1, optical metrology system 100 can include a photometric device with a source 106 and a detector 112. Grating 102 is illuminated by an incident beam 108 from source 106. In the present exemplary embodiment, incident beam 108 is directed onto grating 102 at an angle of incidence $\theta_i$ with respect to normal $\vec{n}$ of grating 102 and an azimuth angle $\Phi$ (i.e., the angle between the plane of incidence beam 108 and the direction of the periodicity of grating 102). Diffracted beam 110 leaves at an angle of $\theta_d$ with respect to normal $\vec{n}$ and is received by detector 112. Detector 112 converts the diffracted beam 110 into a measured metrology signal.

To determine the profile of grating 102, optical metrology system 100 includes a processing module 114 configured to receive the measured metrology signal and analyze the measured metrology signal. As described below, the profile of grating 102 can then be determined using a library-based process or a regression-based process. Additionally, other linear or non-linear profile extraction techniques are contemplated.

2. Library-Based Process of Determining Profile of Structure

In a library-based process of determining the profile of a structure, the measured metrology signal is compared to a library of simulated metrology signals. More specifically, each simulated metrology signal in the library is associated with a profile model of the structure. When a match is made between the measured metrology signal and one of the simulated metrology signals in the library or when the difference of the measured metrology signal and one of the simulated metrology signals is within a preset or termination criterion, the profile model associated with the matching simulated metrology signal is presumed to represent the actual profile of the structure. The matching simulated metrology signal and/or profile model can then be utilized to determine whether the structure has been fabricated according to specifications.

Thus, with reference again to FIG. 1, in one exemplary embodiment, after obtaining a measured metrology signal, processing module 114 then compares the measured metrology signal to simulated metrology signals stored in a library 116. Each simulated metrology signal in library 116 can be associated with a profile model. Thus, when a match is made between the measured metrology signal and one of the simulated metrology signals in library 116, the profile model associated with the matching simulated metrology signal can be presumed to represent the actual profile of grating 102.

The set of profile models stored in library 116 can be generated by characterizing a profile model using a set of parameters, then varying the set of parameters to generate profile models of varying shapes and dimensions. The process of characterizing a profile using a set of parameters can be referred to as parameterizing.

Figure 2A:
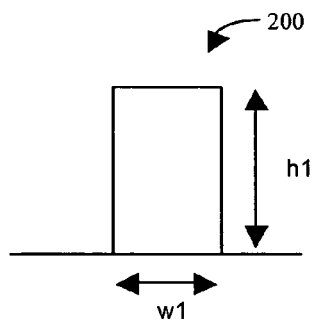
FIGS. 2A–2E depicts exemplary profile models used to model the profile of a structure being examined.
Figure 2B:
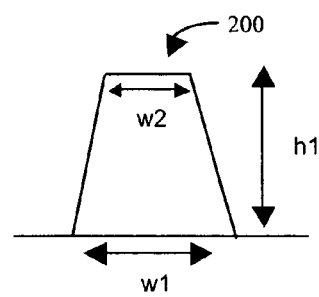
Figure 2C:
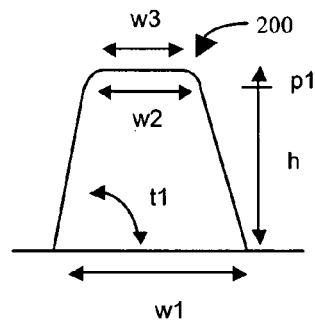
Figure 2D:
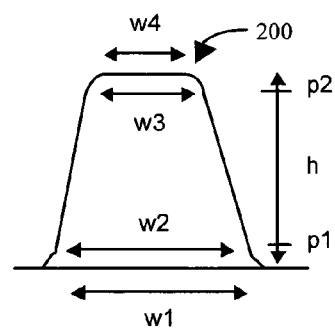
Figure 2E:
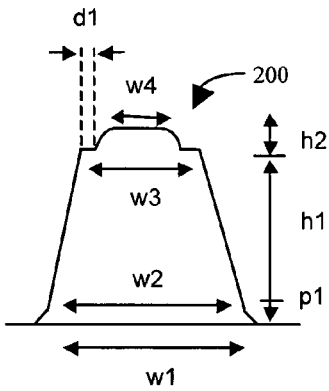

For example, as depicted in FIG. 2A, assume that profile model 200 can be characterized by parameters h1 and w1 that define its height and width, respectively. As depicted in FIGS. 2B to 2E, additional shapes and features of profile model 200 can be characterized by increasing the number of parameters. For example, as depicted in FIG. 2B, profile model 200 can be characterized by parameters h1, w1, and w2 that define its height, bottom width, and top width, respectively. Note that the width of profile model 200 can be referred to as the critical dimension (CD). For example, in FIG. 2B, parameter w1 and w2 can be described as defining the bottom CD and top CD, respectively, of profile model 200.

As described above, the set of profile models stored in library 116 (FIG. 1) can be generated by varying the parameters that characterize the profile model. For example, with reference to FIG. 2B, by varying parameters h1, w1, and w2, profile models of varying shapes and dimensions can be generated. Note that one, two, or all three parameters can be varied relative to one another.

With reference again to FIG. 1, the number of profile models and corresponding simulated metrology signals in the set of profile models and simulated metrology signals stored in library 116 (i.e., the resolution and/or range of library 116) depends, in part, on the range over which the set of parameters and the increment at which the set of parameters are varied. In one exemplary embodiment, the profile models and the simulated metrology signals stored in library 116 are generated prior to obtaining a measured metrology signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscope (AFM), X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Profile of Structure

In a regression-based process of determining the profile of a structure, the measured metrology signal is compared to a simulated metrology signal (i.e., a trial metrology signal). The simulated metrology signal is generated prior to the comparison using a set of parameters (i.e., trial parameters) for a profile model (i.e., a profile model). If the measured metrology signal and the simulated metrology signal do not match or when the difference of the measured metrology signal and one of the simulated metrology signals is not within a preset or termination criterion, another simulated metrology signal is generated using another set of parameters for another profile model, then the measured metrology signal and the newly generated simulated metrology signal are compared. When the measured metrology signal and the simulated metrology signal match or when the difference of the measured metrology signal and one of the simulated metrology signals is within a preset or termination criterion, the profile model associated with the matching simulated metrology signal is presumed to represent the actual profile of the structure. The matching simulated metrology signal and/or profile model can then be utilized to determine whether the structure has been fabricated according to specifications.

Thus, with reference again to FIG. 1, in one exemplary embodiment, processing module 114 can generate a simulated metrology signal for a profile model, and then compare the measured metrology signal to the simulated metrology signal. As described above, if the measured metrology signal and the simulated metrology signal do not match or when the difference of the measured metrology signal and one of the simulated metrology signals is not within a preset or termination criterion, then processing module 114 can iteratively generate another simulated metrology signal for another profile model. In one exemplary embodiment, the subsequently generated simulated metrology signal can be generated using an optimization algorithm, such as global optimization techniques, which includes simulated annealing, local optimization techniques, which includes steepest descent algorithm, or a combination of global and local optimization techniques.

In one exemplary embodiment, the simulated metrology signals and profile models can be stored in a library 116 (i.e., a dynamic library). The simulated metrology signals and profile models stored in library 116 can then be subsequently used in matching the measured metrology signal. For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Profile Refinement

As described above, one common problem in using scatterometry to determine the profile of an integrated circuit structure is profile parameter correlation. For example, for the structure illustrated in FIG. 3, there are three patterned materials M1, M2, and M3 and two unpatterned materials M4 and M5 on a substrate. Very often there are some correlations among the width parameters W1, W2, W3, and W4 or among thickness parameters T1, T1, T2, T3, T4, and T5 or between the width and thickness parameters. However, as noted above, too much correlation between any two or more of these parameters can produce erroneous results in determining the profile of the structure.

Thus, in one exemplary embodiment, a profile refinement process is used, in part, to compensate for profile parameter correlation. More particularly, profile refinement includes determining the profile of an integrated circuit structure from a measured metrology signal by selecting one or more best matches of the measured metrology signal in a profile data space and performing a refinement procedure to determine refined profile parameters. The measured metrology signal may be generated by an optical, electric, electron, or mechanical metrology device. The profile data space may be a profile library of profile parameters and corresponding signals or a collection of data points representing profile parameters and corresponding signals. An exemplary embodiment includes a method and system for ensuring that a specified extent of non-linearity between data points exists so as to ensure consistent results from the refinement calculations.

Figure 4:
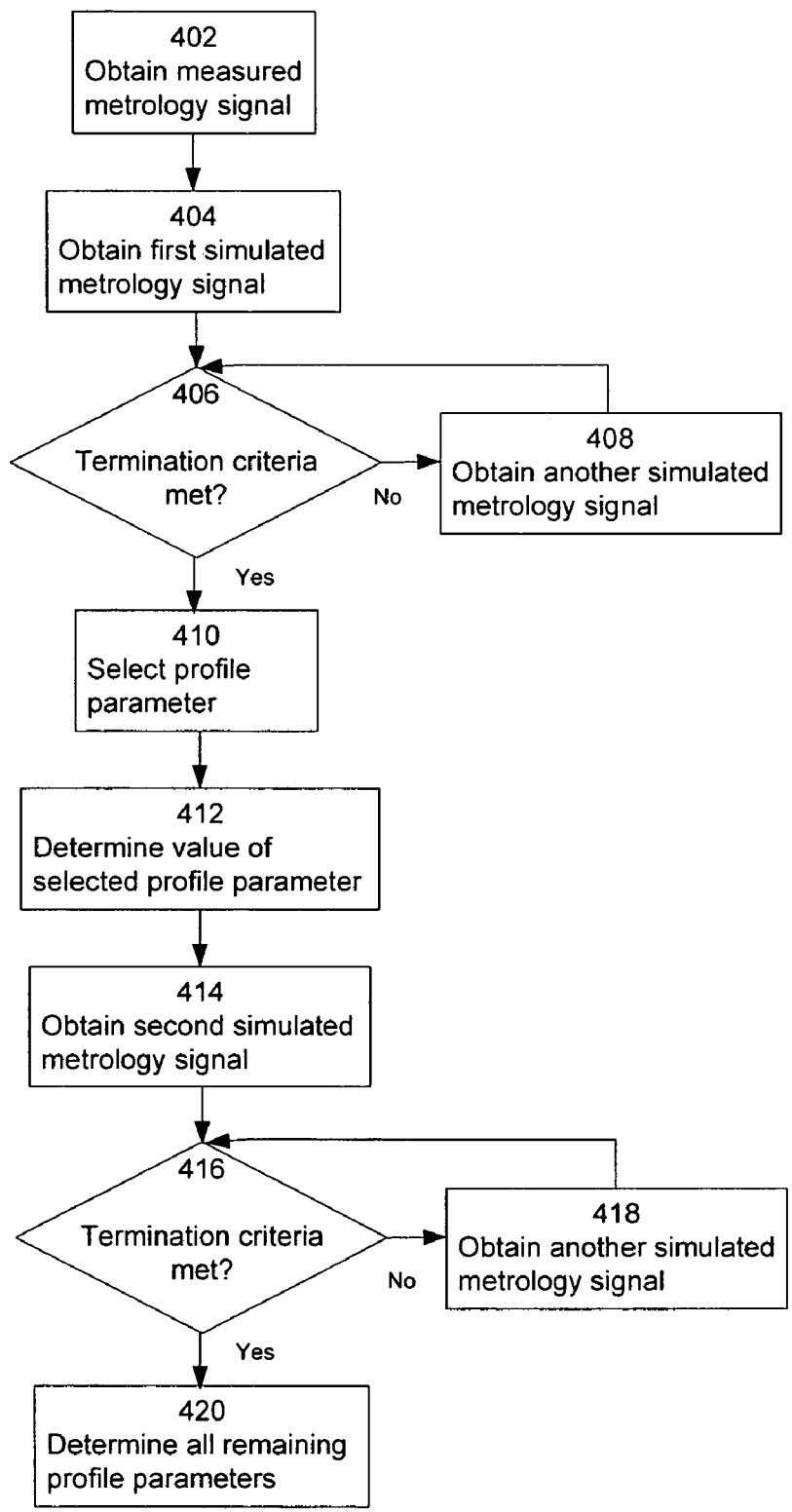
FIG. 4 depicts an exemplary process of determining the profile of an integrated circuit.

FIG. 4 depicts an exemplary process to determine the profile of an integrated circuit structure. In the present exemplary embodiment, a measured metrology signal is obtained 402. A first simulated metrology signal, which has an associated profile model of the structure defined by a set of profile parameters, is obtained 404. The two metrology signals are compared to determine if a first termination criterion is met 406. When the measured metrology signal and the first simulated metrology signal match within the first termination criterion, at least one profile parameter is selected from the set of profile parameters 410. A value for the selected profile parameter is determined 412. A second simulated metrology signal having an associated profile model of the structure defined by a set of profile parameters with at least one profile parameter equal or close to the determined value for the selected profile parameter is obtained 414. The two metrology signals are compared to determine if a first termination criterion is met 416. When the measured and the second simulated metrology signals match within a second termination criterion, values for one or more remaining profile parameters are determined from the set of profile parameters associated with the second simulated metrology signal 420.

In the exemplary embodiment depicted in FIG. 4, when the measured metrology signal and the first simulated metrology signal do not match within the first termination criterion, another simulated metrology signal is obtained 408. Similarly, when the measured metrology signal and the second simulated metrology signal do not match within the second termination criterion, another simulated metrology signal is obtained 418. In both 408 and 418, any number of additional simulated metrology signals can be iteratively obtained until the respective termination criteria are met.

Figure 5:
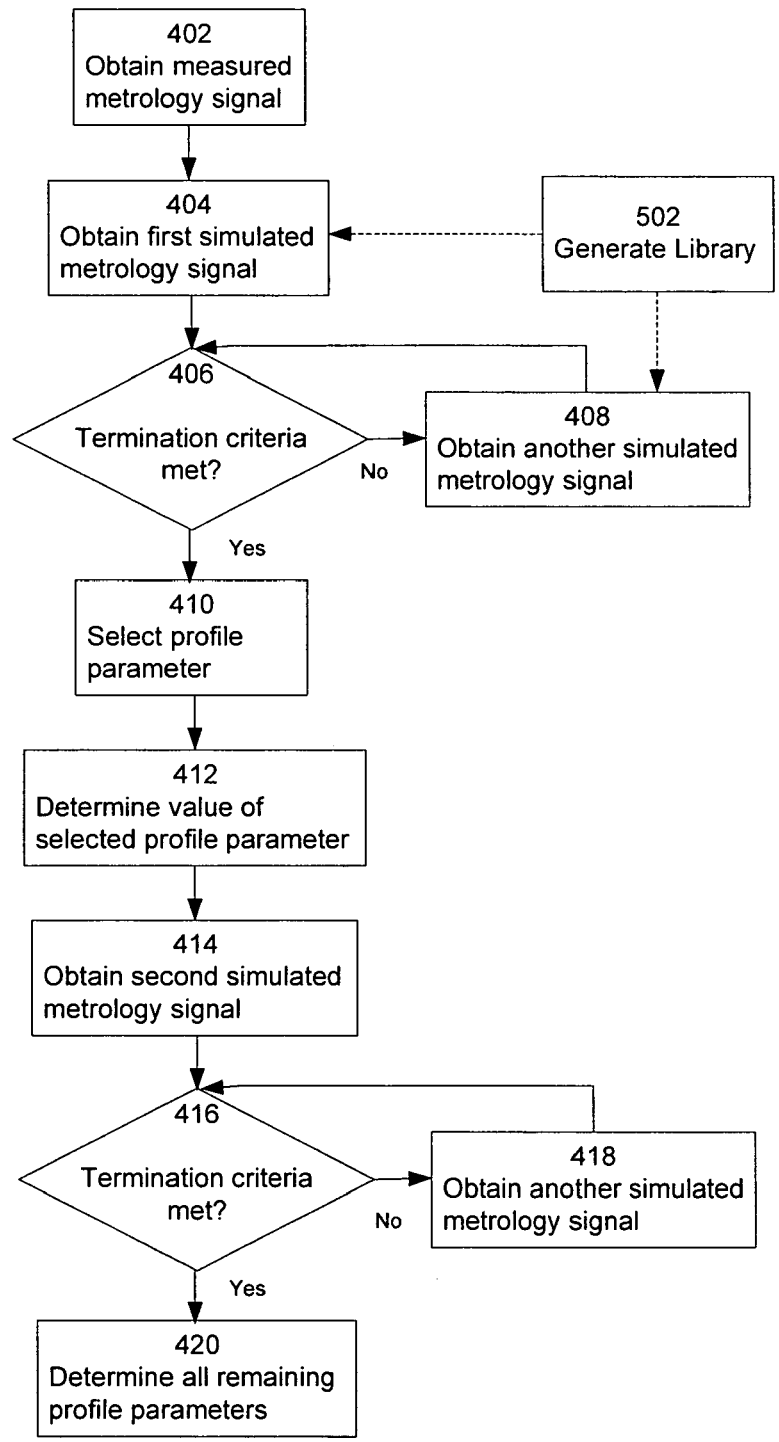
FIG. 5 depicts an exemplary library-based process of determining the profile of an integrated circuit.

FIG. 5 depicts an exemplary library-based process of determining the profile of an integrated circuit structure. In the present exemplary embodiment, a library of simulated metrology signals and associated profile models is generated with all profile parameters floating over ranges of values 502. Thus, the first simulated metrology signal is obtained from the library 404. Additionally, when the measured metrology signal and the first simulated metrology signal do not match within the first termination criterion, another simulated metrology signal is obtained from the library 408.

Figure 6:
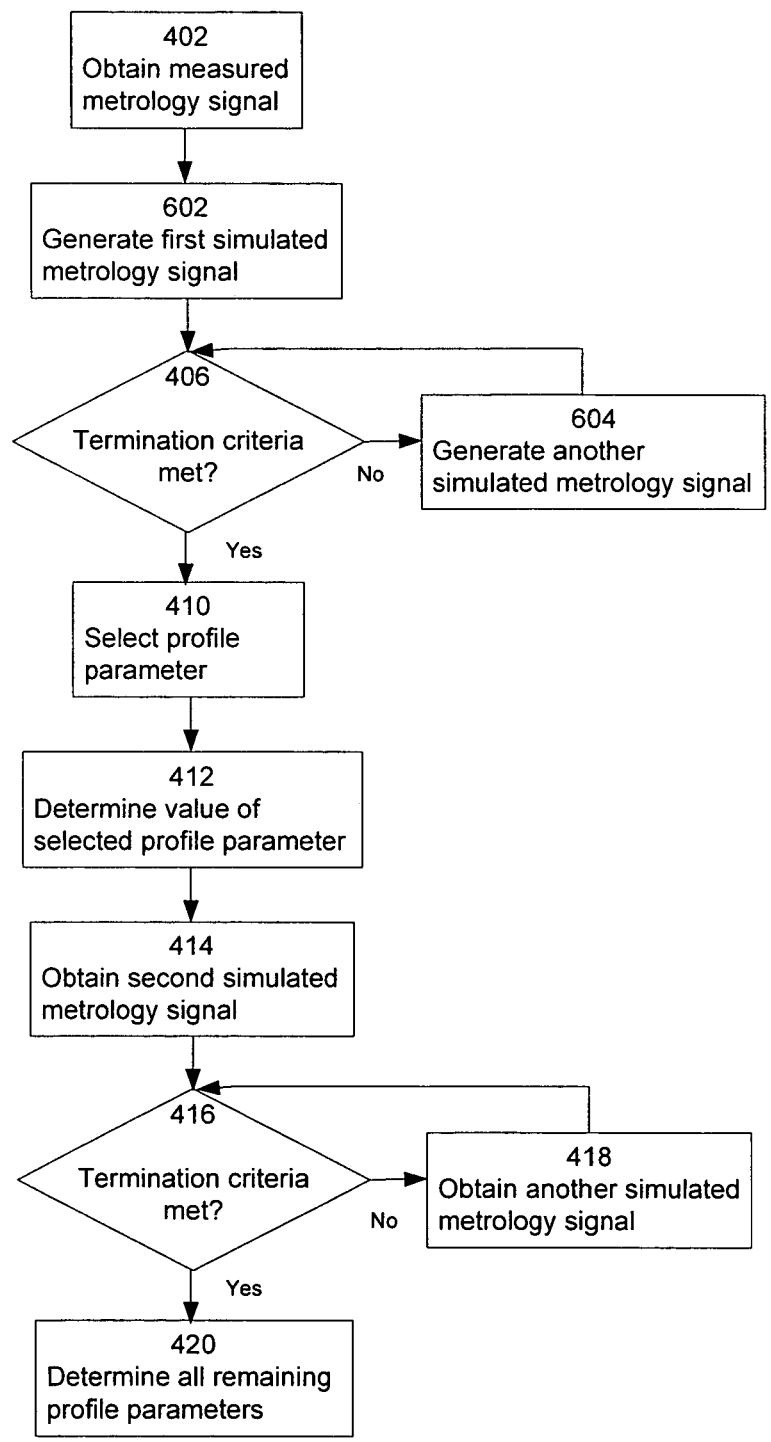
FIG. 6 depicts an exemplary regression-based process of determining the profile of an integrated circuit.

FIG. 6 depicts an exemplary regression-based process of determining the profile of an integrated circuit structure. In the present exemplary embodiment, the first simulated metrology signal is generated using a set of profile parameters 602. When the measured metrology signal and the first simulated metrology signal do not match within the first termination criterion, another simulated metrology signal is generated 604. The set of profile parameters used to generate another simulated metrology signal is determined using optimization techniques, global optimization techniques, or a combination of global and local optimization techniques.

Figure 7:
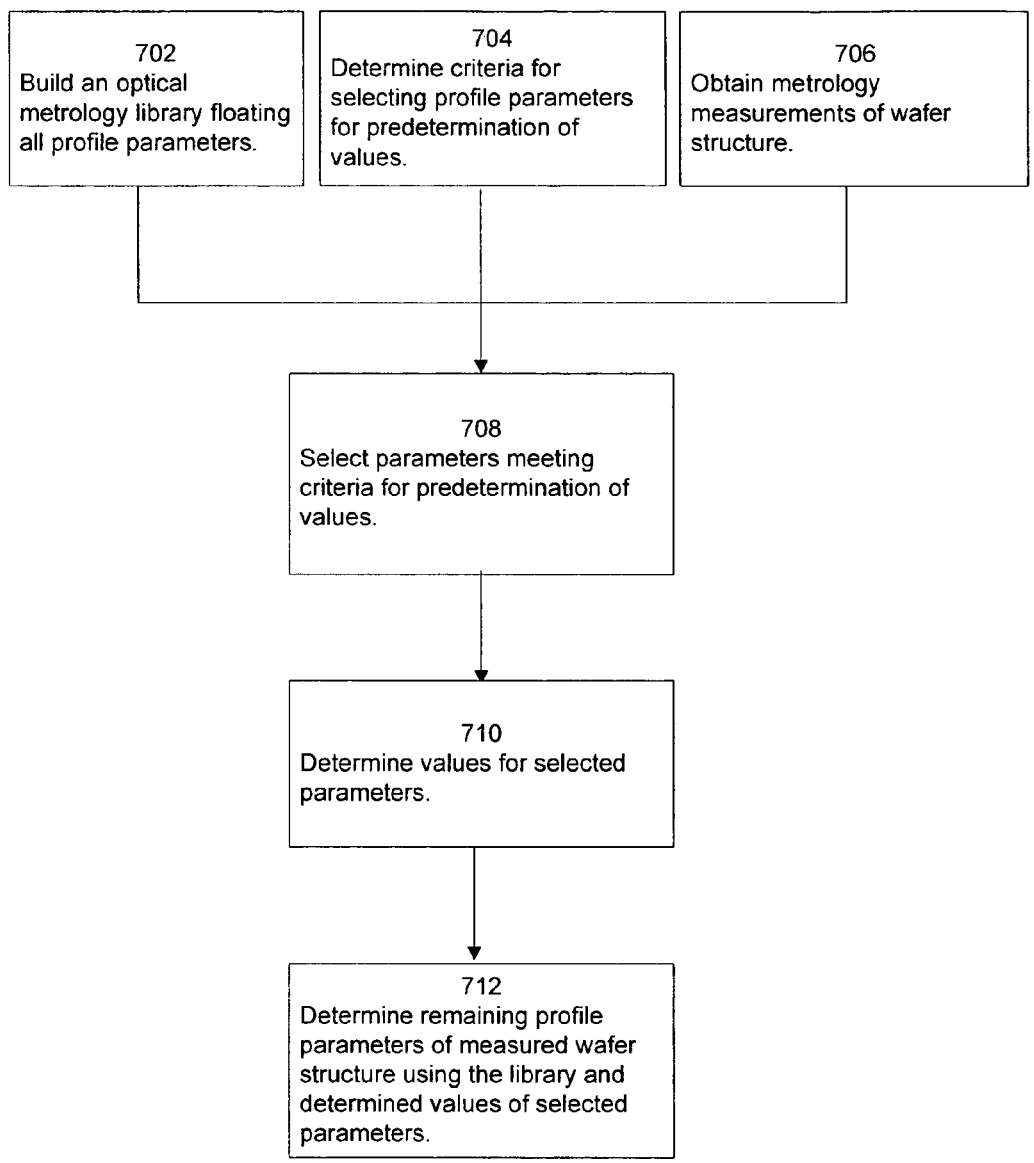
FIG. 7 depicts an exemplary process for selecting and determining the value of selected profile parameters utilizing a library.

FIG. 7 depicts an exemplary process for selecting and determining the value of selected profile parameters utilizing a library. In the present exemplary embodiment, an optical metrology library is built where all the profile parameters are allowed to float over a range of values 702. In a concurrent step, the criterion for selecting profile parameters for predetermination of values is determined 704. A profile parameter may be selected based on a strong correlation to another profile parameter or due to system noise. For example, a structure width such as W1, W2, W3 or W4 or a thickness T1, T2, T3, T4 or T5 in FIG. 3 may be selected for predetermination due to a strong correlation to one or more of the other profile parameters. The criterion may include correlation of at least 0.95 or higher. Profile parameters may also be selected based on fabrication process knowledge, historical information, and/or the ability to get measurements from other metrology tools. For example, thin film measurements may be obtained from metrology tools such as ellipsometers or reflectometers.

In another concurrent step, metrology measurements of the wafer structure are obtained 706 using a metrology device such as a reflectometer or an ellipsometer. Parameters are selected based on meeting the criterion for predetermination of values 708. More specifically, if width W4 is correlated to thickness T4 in FIG. 3 where the correlation is at 0.96 compared to selection criterion of 0.95 correlation, then W4 would be selected for predetermination of value. Values of the selected profile parameters are determined 710, using one of several techniques for determining the parameter values discussed later in connection with FIG. 8. Utilizing the determined values of the selected profile parameters, the remaining profile parameters of the wafer structure are determined 712, using the library built in step 702. Determination of the remaining profile parameters will be discussed in detail in subsequent descriptions in connection with later figures. Continuing with the example above, assume the value determined for T4 is 50 nanometers (nm) in step 710. The remaining profile parameters T1, T2, T3, T5 and W1, W2, W3, and W4 are determined in step 712. It should be recognized that steps 702, 704, and 706 need not necessarily be performed concurrently.

Figure 8:
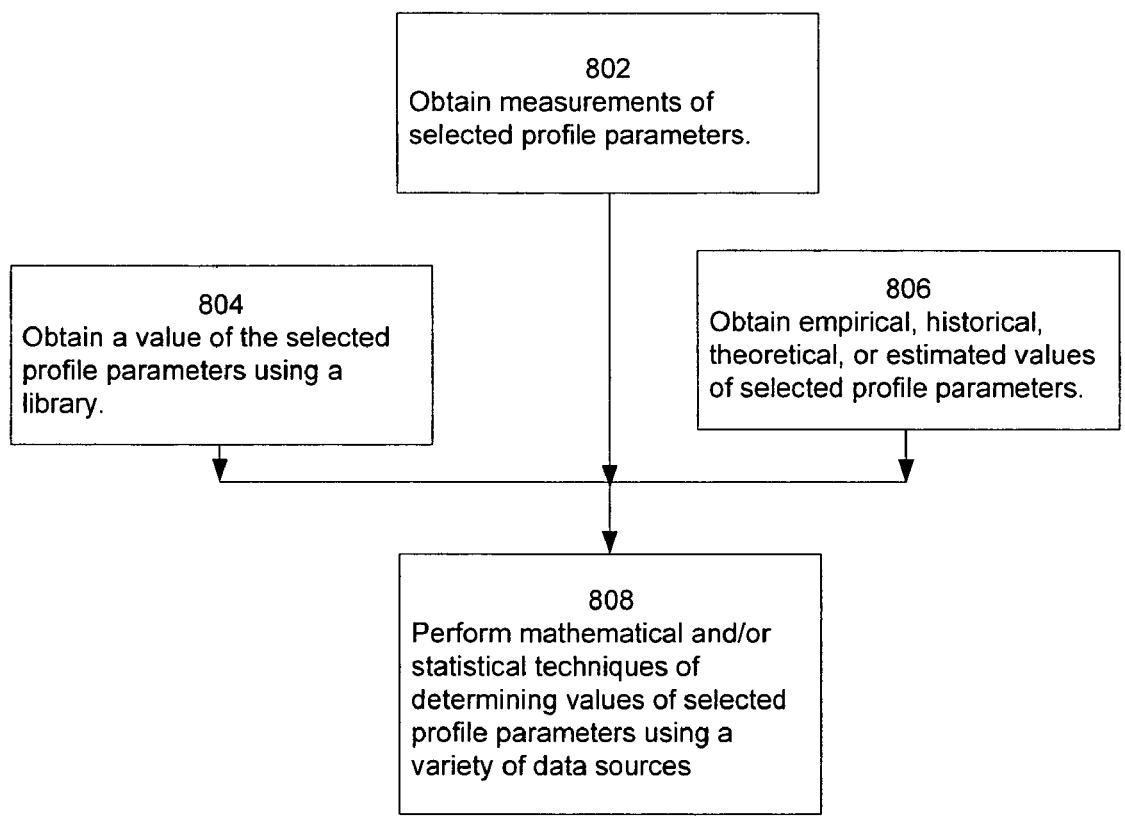
FIG. 8 depicts an exemplary process for obtaining values of selected profile parameters from a variety of sources.

FIG. 8 depicts an exemplary process for obtaining values of selected profile parameters from a variety of sources. One way of getting values for the selected profile parameters is by obtaining specific measurements of the parameter 802. For example, if the selected parameter is width of the structure, measurements of the particular width may be done with SEM or AFM. If the selected parameter is a thickness of an underlying film, the film thickness may be measured using a scatterometric device. The value of a selected parameter may be obtained by using profile extraction using the aforementioned methods 804. The value of the selected parameter is accessed from the set of parameters corresponding to the best match simulated metrology signal from the library. Alternatively, values for the selected parameters may come from theoretical and empirical data, or estimates based on simulations of the fabrication recipe 806 using well known semiconductor fabrication simulation systems. The various sources of values for the selected parameters may further be processed utilizing mathematical and/or statistical techniques 808, which are well known in the art.

In one embodiment utilizing averaging techniques, a number of measurements N on a wafer structure k are performed and the N measured metrology signals are matched against the library. The library may be a regular library or a library created with data points having a determined extent of non-linearity, i.e., an active library. For a more detailed description of active libraries, refer to U.S. Pat. No. 6,609,086, titled PROFILE REFINEMENT FOR INTEGRATED CIRCUIT METROLOY, filed on Feb. 12, 2002, which is incorporated herein by reference in its entirety. For each of the N measured metrology signals, the matching process determines the N best match library signals and the corresponding N profile parameter sets. For this example, assume only W3 and T4 are strongly correlated. Since all the N sites are on the same wafer, and a thin film deposition process can be well controlled so that usually within wafer thickness distribution can be less than 1 nm, T4 is assumed as constant across the wafer.

The average of the N T4 measurements is derived as follows:

$$\overline{T}_4^k = \frac{1}{N} \sum_{j=1}^{N} T_{4,j}^k, \qquad (1.20)$$

where $T_{4,j}^k$ the measurement result of parameter T4 on site j of wafer k. If the error of T4 due to correlation is random, and its variance is $\sigma^2$, then the variance of $\overline{T}_4^k$ is $$\frac{1}{N}\sigma^2.$$

Using $\overline{T}_4^k$ as the value of the parameter T4, determination of the remaining profile parameter may be performed using the same active library.

The process described above is restated using a more general case. Assume that there are M parameters floating in the active library and L wavelengths for each signal. Within the M parameters, a number m of the M parameters are floated during profile extraction and the remaining (M-m) parameters are substituted with their corresponding determined value. Further assume that during profile extraction, parameters $P_1, \ldots, P_m$ are floating, parameters $P_{m+1}, \ldots, P_M$ are to be fixed at the corresponding determined values $P_{m+1}^*, \ldots, P_M^*$. To determine the remaining profile parameters using profile refinement for example, one can either start from the best match profiles found from the process of determining the selected parameter values, or perform a new search in a subspace of library where parameters $P_{m+1}, \ldots, P_M$ fixed at values closest to each of $P_{m+1}^*, \ldots, P_M^*$ in the library. For example, two neighboring values can be used as the subspace in the library where a new search may be performed.

More specifically, let $P^0$ be one of the best-matches, $$P^0 = (P_1^0, \ldots, P_m^0, P_{m+1}^0, \ldots, P_M^0)^T, \qquad (1.40)$$

and its corresponding signal in the library is $S^0$. First, the signal for those fixed parameters is adjusted. Let Jacobian matrix $$J \equiv (J_1, \ldots, J_m, J_{m+1}, \ldots, J_M),$$

and $$J_{float} \equiv (J_1, \ldots, J_m),$$

$$J_{fixed} \equiv (J_{m+1}, \ldots, J_M).$$

Then the adjusted signal IS:

$$S^{adj} = S^0 + J_{fixed} \cdot \left[ \begin{pmatrix} P_{m+1}^* \\ \vdots \\ P_M^* \end{pmatrix} - \begin{pmatrix} P_{m+1}^0 \\ \vdots \\ P_M^0 \end{pmatrix} \right]. \qquad (1.60)$$

Then the extracted values of the remaining parameters is:

$$\begin{pmatrix} P_1^2 \\ \vdots \\ P_m^2 \end{pmatrix} = (J_{float}^T \cdot J_{float})^{-1} \cdot J_{float}^T (S^m - S^{adj}) + \begin{pmatrix} P_1^0 \\ \vdots \\ P_m^0 \end{pmatrix} \qquad (1.80)$$

and the final profile is:

$$P^2 = (P_1^2, \ldots, P_m^2, P_{m+1}^*, \ldots, P_M^*)^T \qquad (2.00).$$

Using the example of the thin film thickness as the parameter selected for predetermination, a value of the thin film thickness is determined by using the average thickness over a number of measurements, and the determined value is used as a fixed value in the process of determining the remaining parameters. For a typical thin film deposition processes, the film thickness distribution across the wafer typically has a fixed signature, and this signature can usually be extracted from an accurate thin film measurement system. For example, the thin film thickness distribution may be characterized as a parabolic distribution, $P_M(r,\theta) = ar^2 + c$ wherein a is known, c is thickness dependent and that r is the radial coordinate on the wafer whose value at the center of the wafer is zero.

The value of c can be calculated from the averaged measured thin film thickness using equation 1.20 above. The remaining parameters may be determined by library matching wherein the calculated film thickness for that location, $P_M(r_j, \theta_j)$, for the value of the fixed parameter $P_{M,j}^k$ is used.

Another more general way of calculating the average value of a parameter such as an underlying film can be expressed as follows:

$$P_M^k = \sum_{j=1}^{N} W_j P_{M,j}^k \qquad (2.20)$$

where $W_j$ is a weighting factor that can be calculated in multiple ways.

One technique utilizes the uncertainty $P_{M,j}^k$ of parameter $P_M$ if available. Then one can use $$W_j = \frac{\frac{1}{\sigma_j}}{\sum_{i=1}^{N} \frac{1}{\sigma_i}} \qquad (2.40)$$

where $\sigma_j$ is measurement uncertainty estimated or calculated using methods well known in the art. The parameter $P_{M,j}^k$ calculation may use the normal method or a sensitivity weighted method. The goal of getting an accurate calculation of $P_{M,j}^k$ is done by utilizing the sensitivity of the signal at a given wavelength to the parameter $P_M$. During the calculation of $P_{M,j}^k$, more weight can be placed for the wavelengths that are sensitive to $P_M$, thus getting a more accurate calculation of $P_{M,j}^k$.

Figure 9:
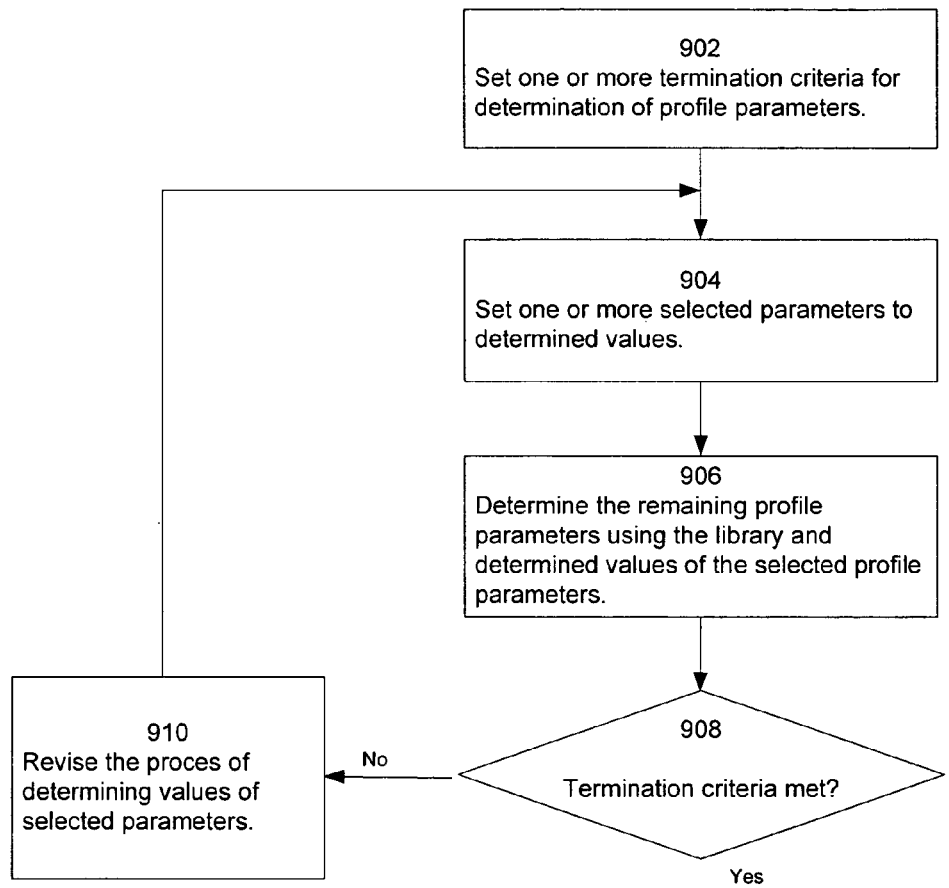
FIG. 9 depicts an exemplary process for determining the values of remaining profile parameters utilizing a library.

FIG. 9 depicts an exemplary process for determining the values of remaining profile parameters utilizing a library. One or more termination criteria for determining profile parameters from metrology measurements are set 902. Examples of termination criteria include goodness of fit or a cost function of the library metrology signal versus the measured metrology signal. More specifically, goodness of fit may be set at equal to or higher than 0.95 or the cost function may be set at less than 2.50. One or more selected parameters are set to determined values 904. If a particular film thickness and/or a structure width are the selected parameters, then the film thickness and the structure width are set to the values determined in a process similar to that included in the description for FIG. 8.

The remaining profile parameters are determined using the library and the determined values of the selected parameters 906. Using the structure depicted in FIG. 3 with five thickness parameters and four width parameters or a total of nine parameters, if T4 and W2 are the selected parameters with values of 15 nm and 60 nm respectively, then the seven remaining parameters are determined using the library and using T4 set at 15 nm and W2 set at 60 nm.

Determination of the remaining parameters includes getting the best match library metrology signal compared to a measured metrology signal and accessing the values of the remaining parameters in the set of profile parameters associated with the best match library metrology signal. The termination criteria are calculated and compared to the previously set termination criteria 908. If the termination criteria are met, the process is complete. Otherwise, the process of determining the values of the selected parameters is revised and steps 904, 906, and 908 are iterated until the termination criteria are met 910.

Revision of the process of determining values of the selected parameters may include use of more than one measurement to get the value of W2. Another revision may include statistical averaging of values of W2 based on measurements of the specific film thickness using pre-selected dies in the wafer.

Figure 10:
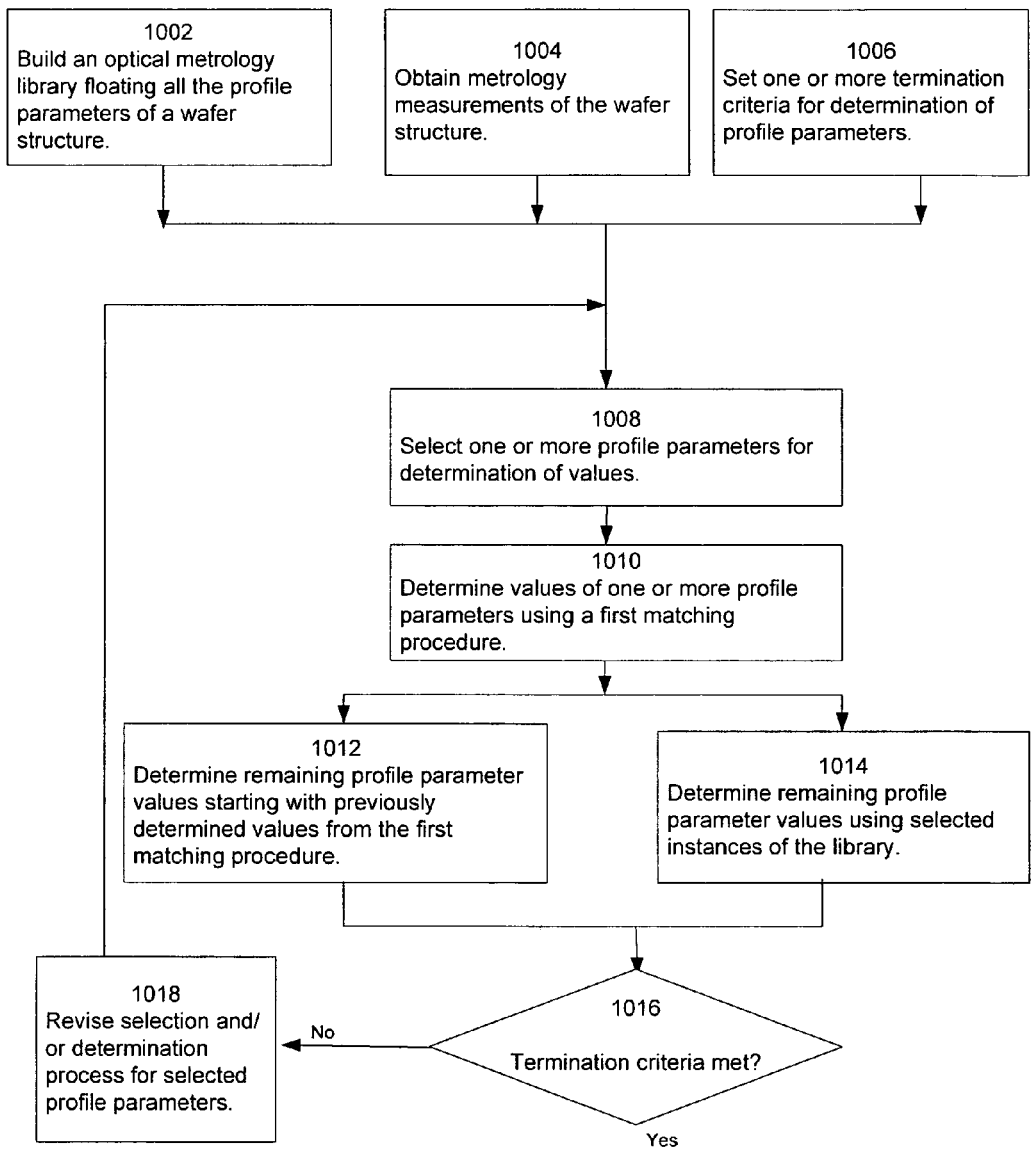
FIG. 10 depicts an exemplary process for determining values of selected parameters utilizing a library and determining the remaining parameter values using previous best match data point or using a subset of the library.

FIG. 10 depicts an exemplary process for determining values of selected parameters utilizing a library and determining the remaining parameter values using previous best match data point or using a subset of the library. This method differs from the previous method described collectively in connection with FIGS. 7, 8, and 9 in two ways. First, a different set of elements is iterated in order to facilitate meeting the process termination criteria. Second, two alternative ways of determining remaining profile parameter values are described.

Referring to FIG. 10, an optical metrology library is built floating all the profile parameters of a wafer structure 1002. Metrology measurements of the wafer structure are obtained 1004. One or more termination criteria for determination of values of profile parameters are set 1006. One or more profile parameters are selected for predetermination of values 1008. Values for the one or more selected profile parameters are determined using a first matching procedure 1010. In one embodiment, values of the remaining profile parameters are determined starting with previously determined values from the first matching procedure 1012. Examples of using the previously determined values include a regression-based optimizer, a localized fine-resolution library procedure, or an iterative library refinement procedure described in detail in U.S. Pat. No. 6,609,086, titled PROFILE REFINEMENT FOR INTEGRATED CIRCUIT METROLOY, filed on Feb. 12, 2002, which is incorporated herein by reference in its entirety.

Alternatively, the remaining profile parameters values are determined by using selected instances of the library wherein the values of the selected profile parameters are equal or close to the determined value of the same profile parameter 1014. For example, if T4 and W2 are the selected parameters for predetermination and T4 and W2 are determined to be 15 nm and 60 nm respectively in the first matching procedure, then the remaining parameter values are determined by considering only instances of the library with T4 equal or close to 15 nm and W2 equal or close to 60 nm.

The termination criteria are calculated and compared to the previously set values 1016. If the termination criteria are met, the process is complete. Otherwise, the process of selecting and determining the values of the selected parameters are revised and steps 1008, 1010, 1012 or 1014, and 1016 are iterated until the termination criteria are met 1018.

Revision of the selection of profile parameters may include using a different correlation coefficient and/or including or excluding system noise impact on a parameter. Revision of the process of determining values of the selected parameters may include use of more than one measurement to get the value of W2. Another revision may include statistical averaging of values of W2 and T4 based on measurements of the specific film thickness or structure width using pre-selected dies in the wafer.

Figure 11:
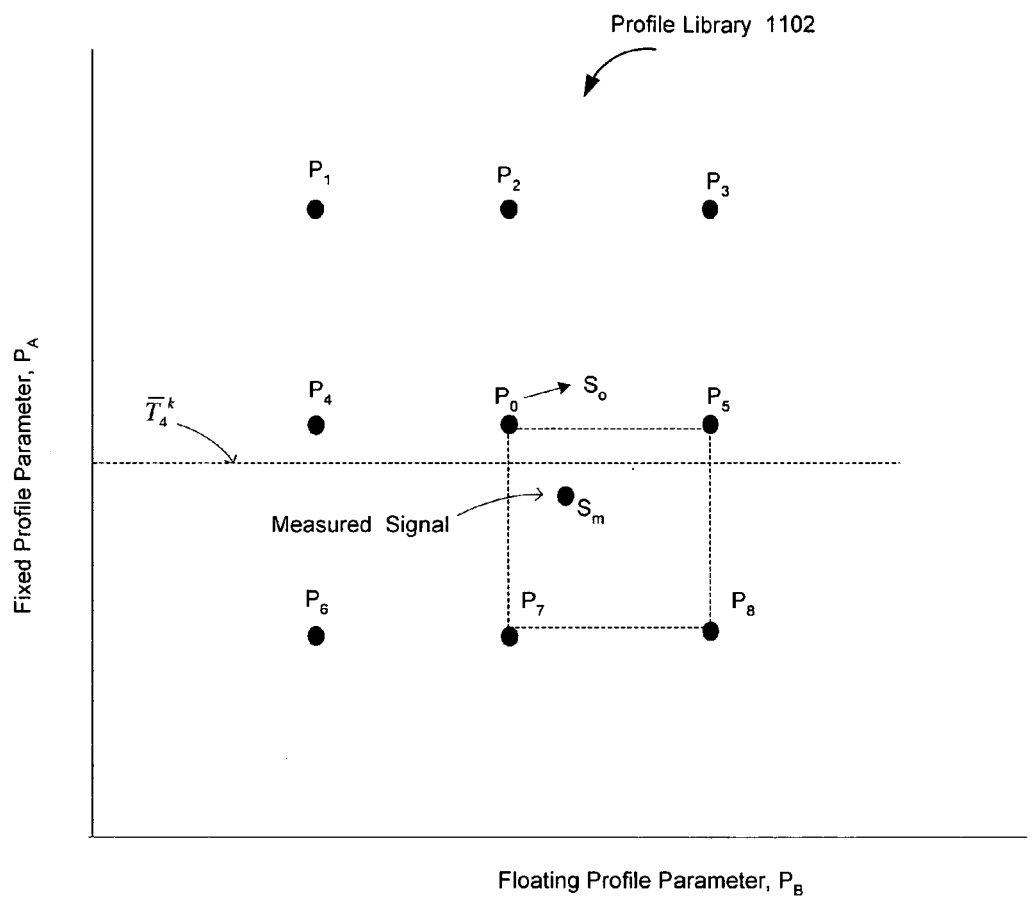
FIG. 11 depicts data points representing determined profile parameter versus floating profile parameters.

FIG. 11 depicts data points representing determined profile parameter versus floating profile parameters. Values of a determined profile parameter $P_A$ in the Y-axis is plotted against corresponding values of a floating profile parameter $P_B$ in the X-axis. $P_0$, $P_1$, $P_2$, $P_3$, $P_4$, $P_5$, $P_6$, $P_7$, and $P_8$ represent data points in a profile library 1102. A metrology measured metrology signal $S_m$ in the corresponding signal library has a best match signal data point designated as $S_o$ with a corresponding best match profile $P_0$. Empirical data, (not shown), demonstrate that using a determined value of profile parameter $P_A$ depicted by the line labeled $T_4^k$, i.e., fixing the value of $P_A$ at $T_4^k$ produces more reliable values of the remaining parameters as exemplified by the floating profile parameter $P_B$ compared to values obtained wherein $P_A$ is allowed to float. Furthermore, through the use of profile refinement procedures described in connection of FIG. 14, the values of the remaining profile parameters can be determined with greater accuracy.

Figure 12:
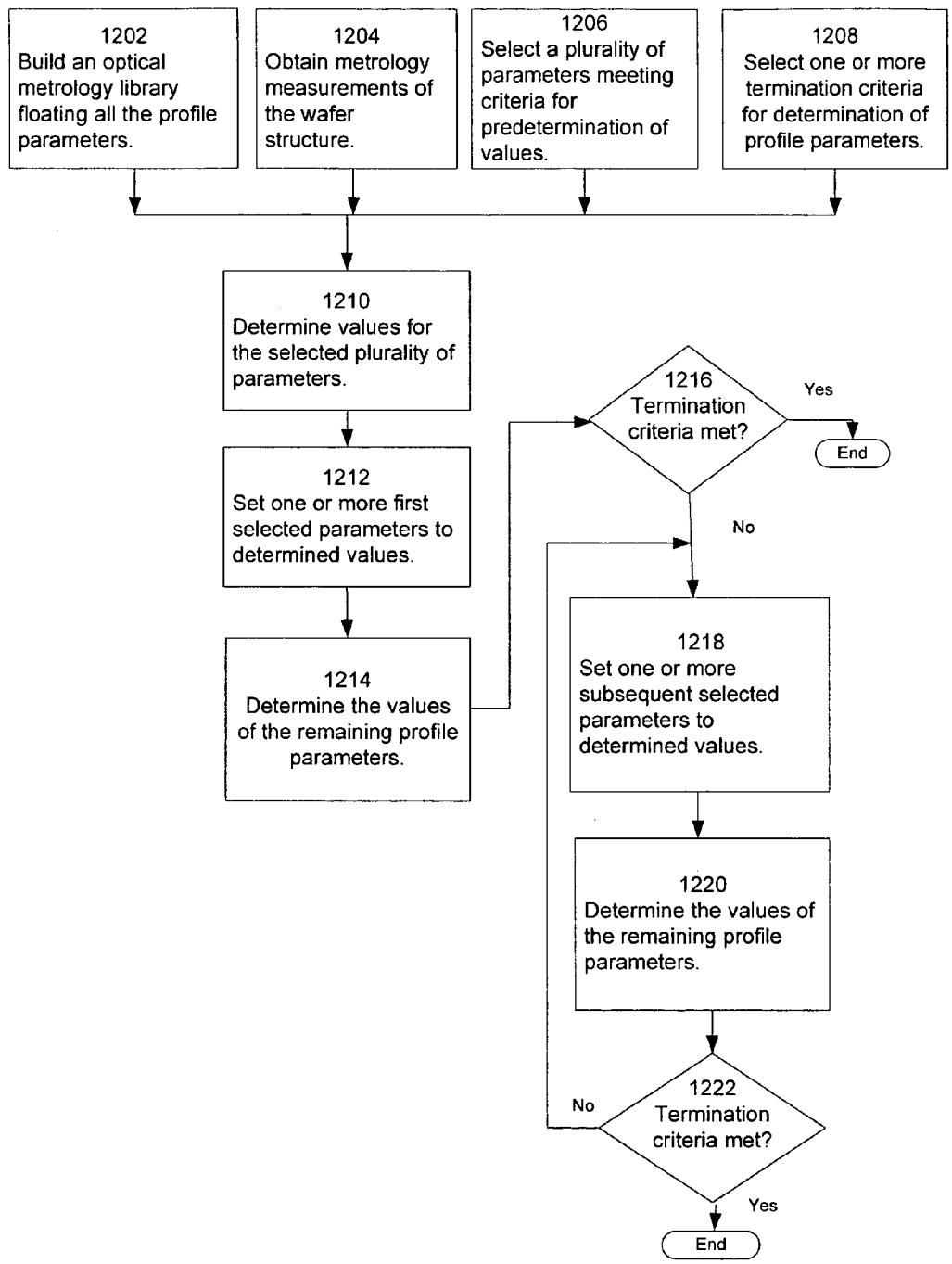
FIG. 12 depicts an exemplary process for sequentially determining the values of selected profile parameters and determining the remaining parameter values until the termination criteria are met.

FIG. 12 depicts an exemplary process for sequentially determining the values of selected profile parameters and determining the remaining parameter values until the termination criteria are met. The key difference of the method depicted in FIG. 12 versus methods described above is that a plurality of profile parameters are first selected and one or more of the selected plurality of profile parameters are set to determined values serially, testing after each iteration if the termination criteria have been met.

Figure 3:
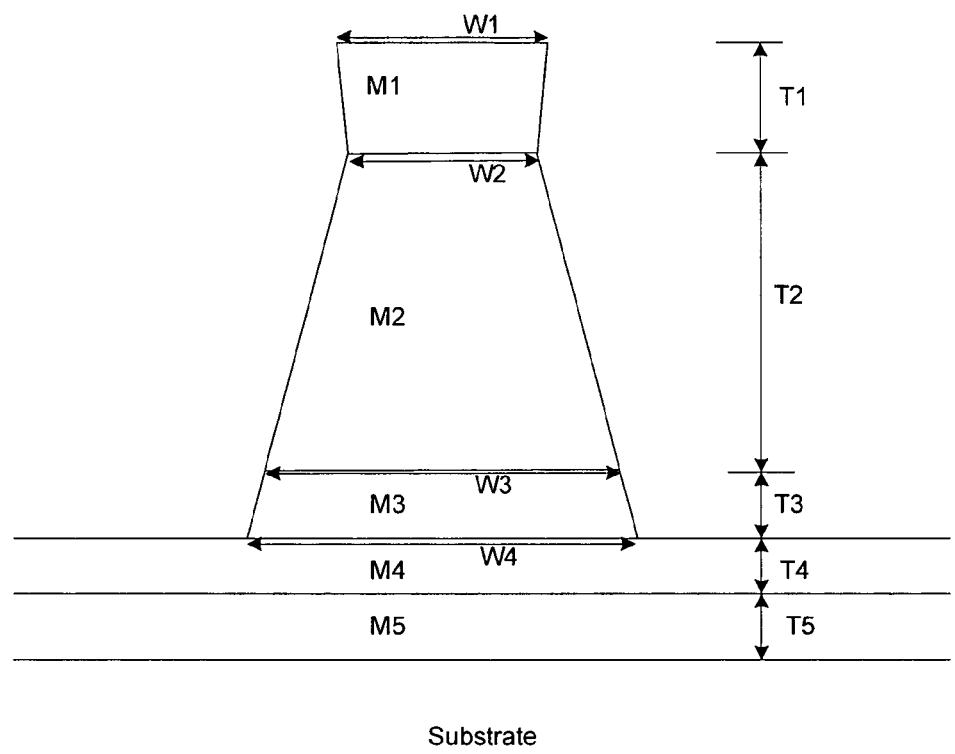
FIG. 3 is a graphical illustration of an integrated circuit profile showing different layers of materials, several widths and thicknesses of the structure in the patterned area.

With reference to FIG. 12, an optical metrology library floating all the profile parameters is built 1202. As mentioned above, an optical metrology model including a profile model of the structure comprising profile parameters is used to build the library. Metrology measurements of the wafer structure modeled are obtained 1204. A plurality of profile parameters are selected based on meeting one or more criteria for assignment of determined values 1206. One or more termination criteria for determination of profile parameters are selected 1208. Values for the selected plurality of parameters are determined 1210. As mentioned above, values may be determined by obtaining a best match from a library or by using values determined from measurement of the parameter, or by using historical or theoretical values. One or more first selected parameters are set to the determined values 1212. Values of the remaining parameters are determined using the determined values of the one or more first selected parameters 1214. For example, if T4 and W2 of FIG. 3 are the first selected parameters for predetermination and T4 and W2 are determined to be 15 nm and 60 nm respectively, then the remaining parameter values are determined by considering only instances of the library with T4 is 15 nm and W2 is 60 nm if a library is used. As mentioned above, the remaining parameter values may be determined using regression and other techniques.

Referring to FIG. 12, the termination criteria are calculated and compared to the previously set values 1216. If the termination criteria are met, the process is terminated. Otherwise, one or more subsequent selected parameters are set to determined values 1218. In one embodiment, values of the subsequent selected parameters determined in step 1210 are used. For example, if W3 in FIG. 3 has a determined value of 90 nm in step 1210, then W3 is set to 90 nm when chosen as subsequent selected parameter. In another embodiment, values of the subsequent selected parameters from the most recent calculation of the remaining parameters are used. For example, if W3 has a value of 93 nm in the most recent calculation of the remaining parameters, (step 1214 or step 1220), then W3 is set to 93 nm when chosen as subsequent selected parameter. The termination criteria are calculated and compared to the previously set values 1222. If the termination criteria are met, the process is terminated; otherwise, steps 1218, 1220, and 1222 are iterated.

Figure 13:
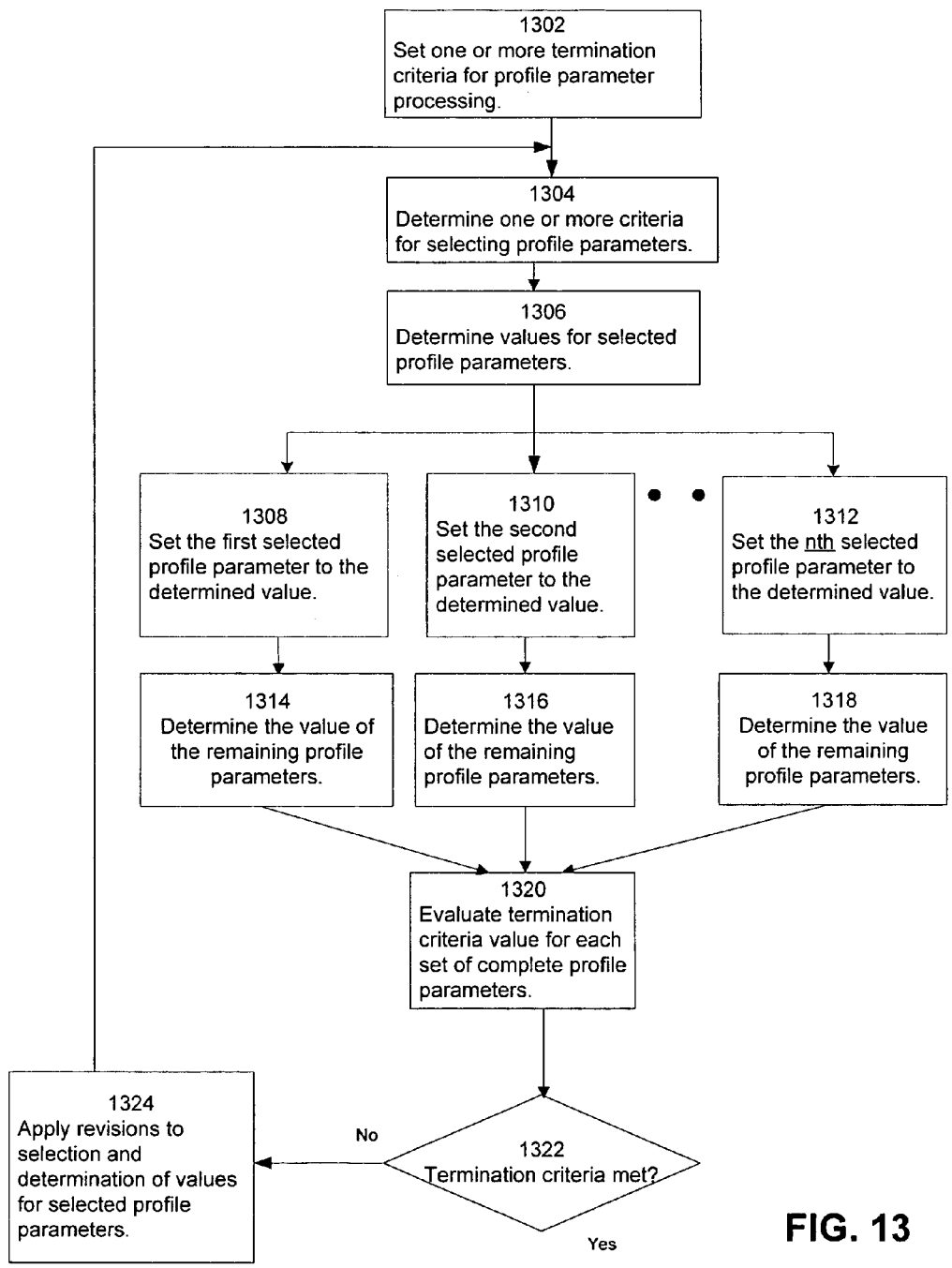
FIG. 13 depicts an exemplary process for determining the values of selected profile parameters and determining the remaining parameter values in parallel until termination criteria are met.

FIG. 13 depicts an exemplary process for determining the values of selected profile parameters and determining the remaining parameter values in parallel until termination criteria are met. The method depicted in FIG. 13 activates parallel processes to evaluate the impact of setting selected parameters to the corresponding determined values, determining the remaining parameters, and determining whether the termination criteria are met.

As in prior methods, one or more termination criteria for profile parameter processing are set 1302. Furthermore, one or more criteria for selecting profile parameters for predetermination of values are determined 1304. Values for the selected profile parameters are determined 1306, utilizing techniques involving libraries matching, regression, and the like. A first selected profile parameter is set to the corresponding determined value 1308, a second selected profile parameter is set to the corresponding determined value 1310 and so on until the nth selected profile parameter is set to the corresponding determined value 1312. The remaining profile parameters associated with each selected parameter set at the corresponding determined value are determined in steps 1314, 1316, and 1318. Termination criteria for each selected parameter and corresponding remaining parameters set are evaluated and ranked 1320. If the one or more termination criteria are met 1322, then selected parameter with the highest rank and the corresponding remaining parameters are deemed as the best set of profile parameters for the wafer structure. Otherwise, revisions to the selection and determination of values of the selected profile parameters are applied 1324 and the process is iterated from steps 1304 to 1322.

As an example for the method depicted in FIG. 13, assume that a termination criterion of 0.960 goodness of fit is set in step 1302. Further, the criterion for selecting parameters for predetermination of value is a correlation coefficient of 0.98. Based on the criterion of 0.98 correlation coefficient, assume further that W2, W3, and T2 in FIG. 3 are the selected parameters. In step 1306, assume further that W2, W3, and T4 are determined, using a library built with all parameters floating, wherein the values are 60 nm, 90 nm, and 15 nm respectively. W2 is the first selected parameter and is set to 60 nm, W3 is the second selected parameter and is set to 90 nm, and T2 is the third and last selected parameter and is set to 15 nm. The remaining parameters are determined with W2 set to 60 nm by profile extraction with the process described with equations (1.40) through (2.00), using only instances of the library wherein W2 is 60 nm. Similarly, the remaining parameters are determined with W3 set to 90 nm by getting the best match from the library, using only instances of the library wherein W3 is 90 nm.

In another case, the remaining parameters are determined with T2 set to 15 nm by profile extraction with the process described with equations (1.40) through (2.00), using only instances of the library wherein T2 is 15 nm. In step 1320, the goodness of fit associated with W2, W3, and T2 as the selected parameters are evaluated and found to be 0.955, 0.960, and 0.983 respectively. The T2 set of parameters rank the highest and also meets the termination criterion of 0.960, ending the process of profile determination. However, if the results calculated only yielded goodness of fit lower that 0.960, then in step 1324, the criterion for selecting parameters for predetermination of value and the method of determining the value may be changed. For example, the criterion for selecting parameters may be changed to 0.95 correlation coefficient and/or regression may be used to determine the values of W2, W3, and T2 instead of using the library.

Figure 14:
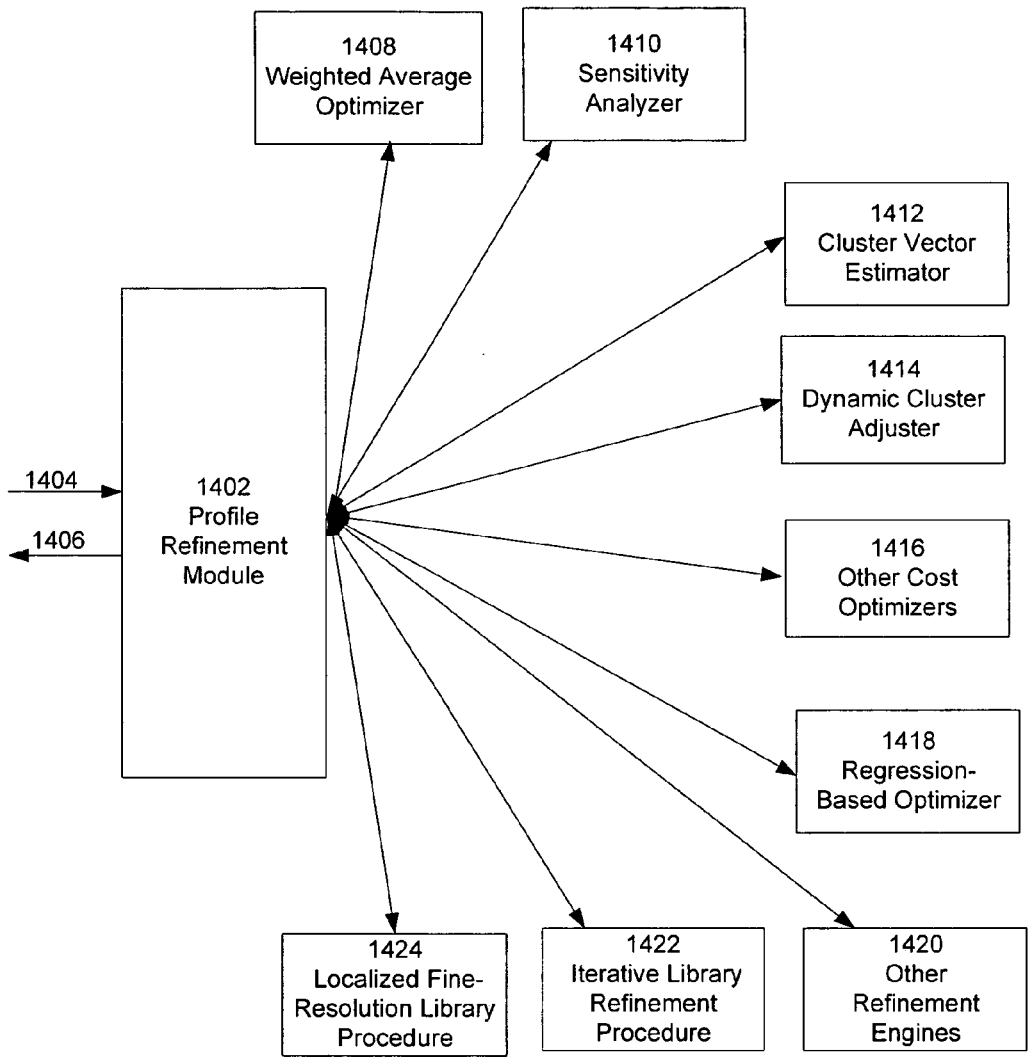
FIG. 14 depicts an exemplary system involving profile refinement invoking various cost optimizers and refinement engines.

FIG. 14 is an architectural diagram illustrating a profile evaluator invoking various refinement engines in exemplary embodiments. A measured metrology signal 1404 is received by the profile refinement module 1402 wherein a profile refinement process is performed, resulting in a set of output profile parameters 1406. The profile refinement module 1402 may activate one or more types of refinement engines to get the desired refinement results based on specified acceptance criteria. A refinement engine may be a software, firmware, or hardware capable of performing the operational steps of refinement given measured metrology signals and a data space comprising signals and associated profile parameters. A weighted average optimizer 1408, sensitivity analyzer 1410, cluster vector estimator 1412, dynamic cluster adjuster 1414, or other cost function optimizers 1416 may be used to generate the refined profile parameters using measured metrology signals and a set of signals and associated profile parameters. A regression-based optimizer 1418 may be used wherein data points within a data space of signals and profile parameters are successively evaluated for goodness of fit compared to the measured metrology signal.

Alternatively, the profile refinement module 1402 may activate a refinement engine using a localized fine-resolution library procedure 1424 or an iterative library refinement procedure 1422. Other refinement engines 1420 may use a refinement technique such as bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, Thiele's refinement algorithm or other refinement algorithms. For a more detailed description of profile refinement, refer to U.S. Pat. No. 6,609,086, titled PROFILE REFINEMENT FOR INTEGRATED CIRCUIT METROLOGY, filed on Feb. 12, 2002, which is incorporated herein by reference in its entirety.

Figure 15:
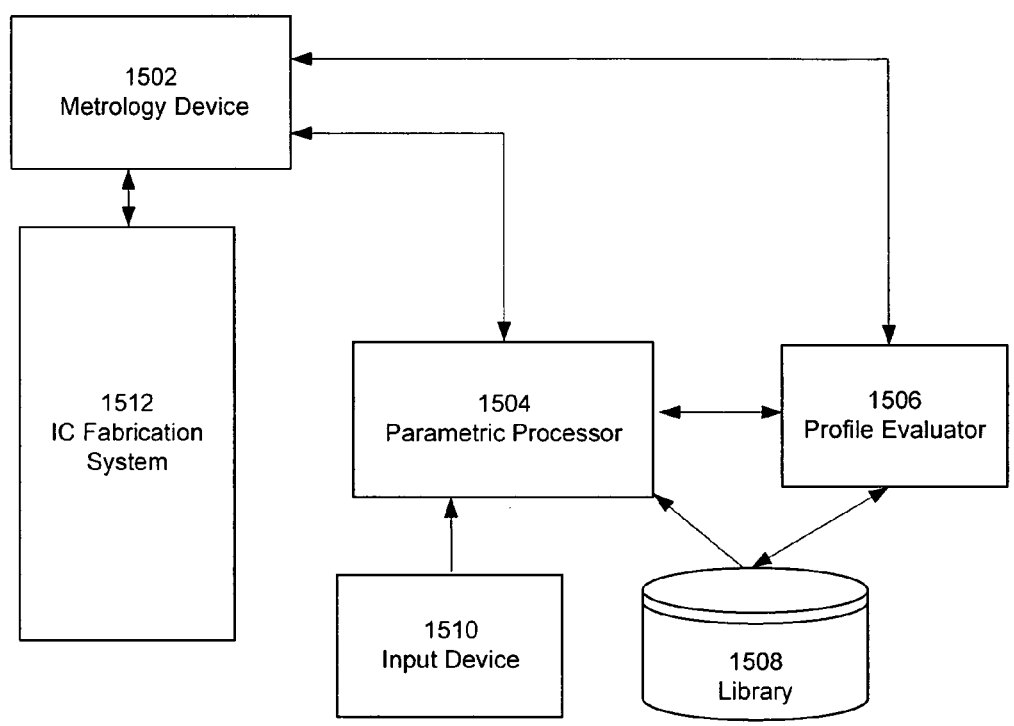
FIG. 15 depicts an exemplary system including a parametric processor and a profile evaluator.

FIG. 15 depicts an exemplary system including a parametric processor and a profile evaluator. An IC fabrication system 1512 such as lithography, etch, or stripping unit is coupled to a metrology device 1502. The metrology device may be an optical, electric, electron, or mechanical metrology system. Examples of optical metrology devices include scatterometric devices such as spectroscopic ellipsometers and reflectometers. Examples of electron metrology systems include CD-scanning electron microscope (CD-SEM), transmission electron microscope (TEM), and focused ion beam (FIB) devices. An example of a mechanical metrology system includes an atomic force microscope (AFM) whereas an example of an electric metrology system includes a capacitance-measuring unit. The metrology device 1502 measures an IC structure and generates a measured metrology signal and transmits the measured metrology signal to the parametric processor 1504 and the profile evaluator 1506. The parametric processor 1504 selects profile parameters for predetermination of value based on data from the input device 1510 or logic pre-programmed in the parametric processor. The parametric processor 1504 may use regression or obtain the best match signal from the library 1508 to determine values for the selected profile parameters. Techniques for obtaining a match from the library may include regular matching process or profile refinement techniques.

Alternatively, the parametric processor 1504 may use data made available through input device 1510 such as historical, empirical, design, simulation or measured data for the selected profile parameters. For example, if the selected profile parameter is film thickness, data made available through input device 1510 may include nominal film thickness, historical film thickness, or film thickness obtained through measurements or simulation using process simulation software. Furthermore, as discussed above, several of these values for film thickness may be further processed with mathematical or statistical techniques to obtain the optimum value. A parametric processor 1504 may be a device, software, or firmware capable of executing library matching, including profile refinement-methods and procedures.

Values determined by the parametric processor 1504 for selected profile parameters are transmitted to the profile evaluator 1506. The profile evaluator 1506 may use regression or obtain the best match signal from the library 1508 to determine values for the remaining profile parameters. Techniques for obtaining a match from the library may include regular matching process or profile refinement techniques. Details for profile refinement techniques are contained in U.S. Pat. No. 6,609,086, titled PROFILE REFINEMENT FOR INTEGRATED CIRCUIT METROLOY, filed on Feb. 12, 2002, which is incorporated herein by reference in its entirety.

The profile evaluator 1506 accesses the profile library 1508. The profile library 1508 may be a physical library in a storage device or a data store in a computer memory or a data store in a storage device. Refined profile parameters are profile parameters calculated using refinement methods and procedures, several of which are described below. A profile evaluator 1506 may be a device, software, or firmware capable of executing library matching, including profile refinement methods and procedures.

FIG. 16 depicts a partial list of profile parameter predetermination and profile parameter extraction techniques. The table of predetermination techniques 1602 shows the various combinations of processes that may be used by the parametric processor and the profile evaluator. Specifically, for predetermination of one or more profile parameters, the parametric processor may use regression to determine the values of the selected parameters. The determination of the remaining profile parameter values may be done using library matching of measured metrology signals or using regression. When the library matching option is used, the matching operation may use the previously obtained best match data point or start over and obtain a new best match. As specified above, the matching operation may consider only the instances of the library where values of the profile parameters in the library are equal or close to the determined value of the parameter. For example, if the selected parameter is film thickness and has a determined value of 20 nm, then the matching operation will only consider instances of the library where the particular film thickness is equal or close to 20 nm. If library matching is used in the parametric processor, determination of the remaining profile parameter values may be done using library matching of measured metrology signals or using regression.

Still referring to FIG. 16, another predetermination technique is by serially determining one or more selected profile parameters and testing after each sequence of processing of the parametric processor and the profile evaluator for successfully meeting the preset termination criteria. Similar to the previous technique, the alternatives include various combinations of regression and library matching for the parametric processor and the profile evaluator. Still another predetermination technique is parallel predetermination wherein a plurality of selected profile parameters may be determined concurrently. Similar to previous techniques, the alternatives include various combinations of regression and library matching for the parametric processor and the profile evaluator.

It is understood that other techniques are feasible along with several other methods of processing for the parametric processor and the profile evaluation, and combinations of such methods. Foregoing described embodiments of the invention are provided as illustrations and descriptions. They are not intended to limit the invention to precise form described. For example, as discussed above, the parallel predetermination technique may be used first to rank selected parameters for predetermination of values. The ranked selected parameters can then be serially processed in order to get the best possible combination of selected parameters based on meeting the termination criteria. Many other variations and combinations of the above techniques are possible. For example, another profile parameter such as pitch may be determined as one of the selected parameters for predetermination. In addition, some of the optical metrology parameters such as index of refraction or extinction coefficient may also be determined from a library wherein the index of refraction or extinction coefficient was allowed to float over a range. To one knowledgeable in the art, the principles and concepts of the present invention can be applied to other applications using models of the object being measured and wherein one or more variable may be selected for predetermination of value.

In particular, it is contemplated that functional implementation of the present invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

We claim:

1. A method of determining the profile of an integrated circuit structure, comprising:
   obtaining a measured metrology signal;
   obtaining a first simulated metrology signal, the first simulated metrology signal having an associated profile model of the structure, wherein the associated profile model is defined by a set of profile parameters; and
   when the measured metrology signal and the first simulated metrology signal match within a first termination criterion,
   a) selecting at least one profile parameter from the set of profile parameters of the profile model associated with the first simulated metrology signal;
   b) determining a value for the selected profile parameter;
   c) obtaining a second simulated metrology signal having an associated profile model of the structure defined by a set of profile parameters with at least one profile parameter equal or close to the determined value for the selected profile parameter; and
   d) when the measured metrology signal and the second simulated metrology signal match within a second termination criterion, determining values for one or more remaining profile parameters from the set of profile parameters of the profile model associated with the second simulated metrology signal.

2. The method of claim 1 further comprising:
   generating a library of simulated metrology signals and associated profile models, the library generated with all profile parameters floating over ranges of values, wherein the first simulated metrology signal is obtained from the library.

3. The method of claim 2 further comprising:
   when the measured metrology signal and the first simulated metrology signal do not match within the first termination criterion, obtaining another simulated metrology signal from the library.

4. The method of claim 2 wherein the second simulated metrology signal is obtained from the library, and wherein when the measured metrology signal and the second simulated metrology signal do not match within the second termination criterion, obtaining from the library another simulated metrology signal having at least one profile parameter equal or close to the determined value for the selected profile parameter.

5. The method of claim 4 wherein the second metrology signal has one or more remaining profile parameters equal or close to one or more remaining profile parameters of the first simulated metrology signal.

6. The method of claim 4 further comprising:
   generating a subset of the library having a subset of the simulated metrology signals and associated profile models,
   wherein the set of profile parameters of the profile models in the subset of the library have at least one profile parameter equal or close to the determined value for the selected profile parameter, and
   wherein the second simulated metrology signal and/or the another simulated metrology signal are obtained from the subset of the library.

7. The method of claim 4 wherein when the measured metrology signal and the second or another simulated metrology signal match within the second termination criterion, the values for the one or more remaining profile parameters are determined from the set of profile parameters that define the profile model corresponding to the second or another simulated metrology signal.

8. The method of claim 2 wherein obtaining the second simulated metrology signal comprises:
   generating the second simulated metrology signal using a set of profile parameters having at least one profile parameter equal or close to the determined value for the selected profile parameter; and
   when the measured metrology signal and the second simulated metrology signal do not match within the second termination criterion, generating another simulated metrology signal using a set of profile parameters having at least one profile parameter equal or close to the determined value for the selected profile parameter.

9. The method of claim 8 further comprising:
   determining one or more remaining profile parameters for the second or another simulated metrology signal using optimization techniques, global optimization techniques, or a combination of global and local optimization techniques.

10. The method of claim 9 wherein when the measured metrology signal and the second or another simulated metrology signal match within the second termination criterion, the values for the one or more remaining profile parameters are determined from the set of profile parameters that define the profile model corresponding to the second or another simulated metrology signal.

11. The method of claim 1 wherein obtaining the first simulated metrology signal comprises:
    generating the first simulated metrology signal using a set of profile parameters; and when the measured metrology signal and the first simulated metrology signal do not match within the first termination criterion, generating another simulated metrology signal using a set of profile parameters having at least one profile parameter different than the profile parameters of the first simulated metrology signal.

12. The method of claim 11 further comprising:
determining the set of profile parameters for the another simulated metrology signal using optimization techniques, global optimization techniques, or a combination of global and local optimization techniques.

13. The method of claim 11 wherein obtaining the second simulated metrology signal comprises:
generating the second simulated metrology signal using a set of profile parameters having at least one profile parameter equal or close to the determined value for the selected profile parameter; and
when the measured metrology signal and the second simulated metrology signal do not match within the second termination criterion, generating another simulated metrology signal using a set of profile parameters having at least one profile parameter equal or close to the determined value for the selected profile parameter.

14. The method of claim 13 further comprising:
determining one or more remaining profile parameters for the second or another simulated metrology signal using optimization techniques, global optimization techniques, or a combination of global and local optimization techniques.

15. The method of claim 11 wherein the second simulated metrology signal is obtained from a library of simulated metrology signals and associated profile models, and wherein when the measured metrology signal and the second simulated metrology signal do not match within the second termination criterion, obtaining from the library another simulated metrology signal having at least one profile parameter equal or close to the determined value for the selected profile parameter.

16. The method of claim 15 wherein the second metrology signal has one or more remaining profile parameters equal or close to one or more remaining profile parameters of the first simulated metrology signal.

17. The method of claim 15 further comprising:
generating a subset of the library having a subset of the simulated metrology signals and associated profile models,
wherein the set of profile parameters of the profile models in the subset of the library have at least one profile parameter equal or close to the determined value for the selected profile parameter, and
wherein the second simulated metrology signal and/or the another simulated metrology signal are obtained from the subset of the library.

18. The method of claim 1 wherein selecting at least one profile parameter comprises:
determining one or more criteria for selecting the at least one profile parameter; and
selecting one or more profile parameters from the set of profile parameters that meet the one or more criteria.

19. The method of claim 18 wherein the one or more criteria, includes an amount of correlation to another profile parameter.

20. The method of claim 1 wherein determining the value for the selected profile parameter comprises:
obtaining values from empirical, historical, theoretical, and/or simulated data of the selected profile parameter.

21. The method of claim 1 wherein determining the value for the selected profile parameter comprises:
measuring the selected profile parameter with a metrology device.

22. The method of claim 21 wherein the metrology device is at least one of a reflectometer, an ellipsometer, a scatterometer, a critical dimension scanning electron microscope, an atomic force microscope, or a cross-section scanning electron microscope.

23. The method of claim 21 wherein the measurement of the selected profile parameter is performed for more than one site and values determined from the measurements are weighted using statistical techniques.

24. The method of claim 21 wherein the selected profile parameter is film thickness of an underlying film or a width of the structure.

25. The method of claim 1 wherein the second simulated metrology signal is obtained using at least one of a weighted average optimizer, a sensitivity analyzer, a cluster vector estimator, a dynamic cluster adjuster, a regression-based optimizer, a localized fine-resolution library procedure, and an iterative library refinement procedure.

26. A method of determining the profile of an integrated circuit structure from a measured metrology signal, the method comprising:
a) developing an optical metrology model for a structure, the metrology model including a profile model of the structure, the profile model comprising profile parameters;
b) selecting a first profile parameter for determination of value;
c) determining the value of the selected first profile parameter;
d) determining values of remaining profile parameters using the determined value of the selected first profile parameter and using one or more measured metrology signals off the structure;
e) setting one or more subsequent termination criteria for terminating parameter predetermination;
f) selecting a subsequent profile parameter for determination of value;
g) determining the value of the selected subsequent profile parameter;
h) determining values of remaining profile parameters using the determined values of the selected first and selected subsequent profile parameters and using one or more measured metrology signals off the structure; and
i) iterating steps f) to h) until the one or more subsequent termination criteria for parameter predetermination are met.

27. The method of claim 26 wherein determining the value of the first selected profile parameter comprises:
creating a library of simulated metrology signals and associated profile parameters, the library created with all the profile parameters floating over corresponding ranges of values;
determining a best match simulated metrology signal from the library corresponding to a measured metrology signal; and
accessing a value of the first profile parameter from profile parameter values associated with the best match simulated metrology signal from the library.

28. The method of claim 27 wherein determining the best match simulated metrology signal from the library comprises:

determining the best match simulated metrology signal from the library utilizing a profile refinement procedure.

29. The method of claim 27 wherein determining the best match simulated metrology signal from the library comprises:
comparing the measured metrology signal to a subset of library instances, the subset of the library instances corresponding to library instances wherein value of the selected first profile parameter of the library instance is equal or close to the determined value of the selected first profile parameter.

30. The method of claim 26 wherein determining values of the remaining profile parameters using the determined values of the selected first and selected subsequent profile parameters comprises:
j) setting one or more subsequent termination criteria for regression;
k) determining a set of values for the remaining profile parameters;
l) calculating a simulated metrology signal corresponding to the selected set of values for the remaining profile parameters and the determined value of the first and all subsequent selected profile parameters; and
m) iterating steps k) and l) until the one or more subsequent termination criteria for regression are met.

31. A method of determining the profile of an integrated circuit structure from a measured metrology signal, the method comprising:
developing an optical metrology model for a structure, the metrology model including a profile model of the structure, the profile model comprising profile parameters;
selecting a plurality of profile parameters for determination of value;
determining values of the selected plurality of profile parameters; and
determining values of remaining profile parameters using the determined values of the selected plurality of profile parameters and using one or more measured metrology signals off the structure.

32. The method of claim 31 wherein determining the values of the selected plurality of profile parameters comprises:
for each selected profile parameter of the plurality of profile parameters:
a) setting one or more termination criteria for regression;
b) selecting a set of values for the profile parameters;
c) calculating a simulated metrology signal corresponding to the selected set of values of the profile parameters;
d) iterating steps b) and c) until the one or more termination criteria for regression are met; and
e) designating the value of the of the selected profile parameter of the plurality of profile parameters when the one or more termination criteria for regression are met as the determined value of the selected profile parameter of the plurality of profile parameters.

33. The method of claim 31 wherein determining the values of remaining profile parameters comprises:
creating a library of simulated metrology signals and associated profile parameters, the library created with all the profile parameters floating over corresponding ranges of values;
determining a best match simulated metrology signal from the library corresponding to the one or more measured metrology signals; and
accessing profile parameter values associated with the corresponding best match simulated metrology signal from the library.

34. The method of claim 33 wherein determining the best match simulated metrology signal from the library corresponding to the measured metrology signal comprises:
comparing the measured metrology signal to a subset of library instances, the subset of the library instances corresponding to library instances wherein values of the selected plurality of profile parameters of the library instance are equal or close to the corresponding determined values of the selected plurality of profile parameters.

35. The method of claim 31 wherein determining the values of remaining profile parameters comprises:
performing regression utilizing the determined values of the selected plurality of profile parameters with the remaining profile parameters floating over corresponding ranges of values.

36. A method of determining the profile of an integrated circuit structure from a measured metrology signal, the method comprising:
a) setting one or more termination criteria for parametric optimization;
b) developing an optical metrology model for a structure, the metrology model including a profile model of the structure, the profile model comprising profile parameters;
c) selecting a plurality of profile parameters for determination of value;
d) determining values of the selected plurality of profile parameters;
e) ranking the plurality of profile parameters using the one or more termination criteria for parametric optimization;
f) determining values of remaining profile parameters using the determined values of one or more profile parameters of the selected plurality of profile parameters and using at least one measured metrology signal off the structure; and
g) iterating steps c), d), e), and f) until the one or more termination criteria for parametric optimization are met.

37. A system for determining the profile of an integrated circuit structure, comprising:
a parametric processor configured to obtain a measured metrology signal and a first simulated metrology signal, the first simulated metrology signal having an associated profile model of the structure, wherein the associated profile model is defined by a set of profile parameters; and
a profile evaluator coupled to the parametric processor, wherein when the measured metrology signal and the first simulated metrology signal match within a first termination criterion, the profile evaluator is configured to:
a) select at least one profile parameter from the set of profile parameters of the profile model associated with the first simulated metrology signal;
b) determine a value for the selected profile parameter;
c) obtain a second simulated metrology signal having an associated profile model of the structure defined by a set of profile parameters with at least one profile parameter equal or close to the determined value for the selected profile parameter; and
d) when the measured metrology signal and the second simulated metrology signal match within a second termination criterion, determine values for one or more remaining profile parameters from the set of profile parameters of the profile model associated with the second simulated metrology signal.

38. The system of claim 37 further comprising:
a library of simulated metrology signals and associated profile models, the library generated with all profile parameters floating over ranges of values, wherein the first simulated metrology signal is obtained from the library.

39. The system of claim 38 wherein when the measured metrology signal and the first simulated metrology signal do not match within the first termination criterion, the parametric processor obtains another simulated metrology signal from the library.

40. The system of claim 38 wherein the second simulated metrology signal is obtained from the library, and wherein when the measured metrology signal and the second simulated metrology signal do not match within the second termination criterion, the profile evaluator obtains from the library another simulated metrology signal having at least one profile parameter equal or close to the determined value for the selected profile parameter.

41. The system of claim 40 wherein the second metrology signal has one or more remaining profile parameters equal or close to one or more remaining profile parameters of the first simulated metrology signal.

42. The system of claim 40 further comprising:
a subset of the library having a subset of the simulated metrology signals and associated profile models,
wherein the set of profile parameters of the profile models in the subset of the library have at least one profile parameter equal or close to the determined value for the selected profile parameter, and
wherein the profile evaluator obtains the second simulated metrology signal and/or the another simulated metrology signal from the subset of the library.

43. The system of claim 40 wherein when the measured metrology signal and the second or another simulated metrology signal match within the second termination criterion, the profile evaluator determines the values for the one or more remaining profile parameters from the set of profile parameters that define the profile model corresponding to the second or another simulated metrology signal.

44. The system of claim 38 wherein the profile evaluator obtain the second simulated metrology signal by:
generating the second simulated metrology signal using a set of profile parameters having at least one profile parameter equal or close to the determined value for the selected profile parameter; and
when the measured metrology signal and the second simulated metrology signal do not match within the second termination criterion, generating another simulated metrology signal using a set of profile parameters having at least one profile parameter equal or close to the determined value for the selected profile parameter.

45. The system of claim 37 wherein the parametric processor obtains the first simulated metrology signal by:
generating the first simulated metrology signal using a set of profile parameters; and
when the measured metrology signal and the first simulated metrology signal do not match within the first termination criterion, generating another simulated metrology signal using a set of profile parameters having at least one profile parameter different than the profile parameters of the first simulated metrology signal.

46. The system of claim 45 wherein the profile evaluator obtains the second simulated metrology signal by:
generating the second simulated metrology signal using a set of profile parameters having at least one profile parameter equal or close to the determined value for the selected profile parameter; and
when the measured metrology signal and the second simulated metrology signal do not match within the second termination criterion, generating another simulated metrology signal using a set of profile parameters having at least one profile parameter equal or close to the determined value for the selected profile parameter.

47. The system of claim 45 further comprising:
a library of simulated metrology signals and associated profile models, wherein the profile evaluator obtains the second simulated metrology signal from the library, and wherein when the measured metrology signal and the second simulated metrology signal do not match within the second termination criterion, the profile evaluator obtains from the library another simulated metrology signal having at least one profile parameter equal or close to the determined value for the selected profile parameter.

48. The system of claim 47 further comprising:
a subset of the library having a subset of the simulated metrology signals and associated profile models,
wherein the set of profile parameters of the profile models in the subset of the library have at least one profile parameter equal or close to the determined value for the selected profile parameter, and
wherein the profile evaluator obtains the second simulated metrology signal and/or the another simulated metrology signal from the subset of the library.

49. The system of claim 37 further comprising:
a metrology device configured to measure metrology signals off the wafer structure and transmit the measured metrology signals, the metrology device coupled to the parametric processor and the profile evaluator.

50. The system of claim 49 wherein the metrology device is a reflectometer or an ellipsometer.

51. The system of claim 37 wherein the parametric processor selects the one or more profile parameters based on correlation of a selected profile parameter of the one or more profile parameters to another one or more profile parameters.

52. The system of claim 51 wherein the selected profile parameter is a film thickness or a structure width.

53. The system of claim 37 wherein the parametric processor is further configured to:
apply mathematical and/or statistical techniques to determine the value of the selected one or more profile parameters from empirical, historical, theoretical, and/or simulation data and/or measurements obtained with metrology devices.

54. A computer-readable storage medium containing computer executable code to determine the profile of a wafer structure from a measured metrology signal by instructing a computer to operate as follows:
a) obtaining an optical metrology model for a structure, the metrology model including a profile model of the structure, the profile model comprising profile parameters;
b) selecting a first profile parameter for determination of value;
c) determining the value of the selected first profile parameter;

d) determining values of remaining profile parameters using the determined value of the selected first profile parameter and using one or more measured metrology signals off the structure;
e) setting one or more subsequent termination criteria for terminating parameter predetermination;
f) selecting a subsequent profile parameter for determination of value;
g) determining the value of the selected subsequent profile parameter;
h) determining values of remaining profile parameters using the determined values of the selected first and selected subsequent profile parameters and using one or more measured metrology signals off the structure; and
i) iterating steps f) to h) until the one or more subsequent termination criteria for parameter predetermination are met.

55. A computer-readable storage medium of claim 54 containing computer executable code further instructing a computer to operate as follows:
   j) setting one or more subsequent termination criteria for regression;
   k) determining a set of values for the remaining profile parameters;
   l) calculating a simulated metrology signal corresponding to the selected set of values for the remaining profile parameters and the determined value of the first and all subsequent selected profile parameters; and
   m) iterating steps k) and l) until the one or more subsequent termination criteria for regression are met.

56. A computer-readable storage medium containing computer executable code to determine the profile of a wafer structure from a measured metrology signal by instructing a computer to operate as follows:
   a) setting one or more termination criteria for parametric optimization;
   b) obtaining an optical metrology model for a structure, the metrology model including a profile model of the structure, the profile model comprising profile parameters;
   c) selecting a plurality of profile parameters for determination of value;
   d) determining values of the selected plurality of profile parameters;
   e) ranking the plurality of profile parameters using the one or more termination criteria for parametric optimization;
   f) determining values of remaining profile parameters using the determined values of one or more profile parameters of the selected plurality of profile parameters and using at least one measured metrology signal off the structure; and
   g) iterating steps c), d), e), and f) until the one or more termination criteria for parametric optimization are met.

* * * * *